United States Patent
Lim

(10) Patent No.: US 9,525,156 B2
(45) Date of Patent: Dec. 20, 2016

(54) DEPOSITION APPARATUS, DEPOSITION METHOD USING THE SAME, AND MANUFACTURING METHOD OF ORGANIC LIGHT-EMITTING DISPLAY APPARATUS

(71) Applicant: Samsung Display Co., LTD., Yongin, Gyeonggi-Do (KR)

(72) Inventor: Jea-Roung Lim, Yongin (KR)

(73) Assignee: SAMSUNG DISPLAY CO., LTD. (KR)

( * ) Notice: Subject to any disclaimer, the term of this patent is extended or adjusted under 35 U.S.C. 154(b) by 221 days.

(21) Appl. No.: 14/202,672

(22) Filed: Mar. 10, 2014

(65) Prior Publication Data

US 2015/0044800 A1 Feb. 12, 2015

(30) Foreign Application Priority Data

Aug. 6, 2013 (KR) .................. 10-2013-0093336

(51) Int. Cl.

| | |
|---|---|
| *B05D 5/12* | (2006.01) |
| *H01L 51/56* | (2006.01) |
| *C23C 14/54* | (2006.01) |
| *C23C 14/56* | (2006.01) |
| *H01L 51/52* | (2006.01) |
| *H01L 27/32* | (2006.01) |

(52) U.S. Cl.
CPC ............ *H01L 51/56* (2013.01); *C23C 14/54* (2013.01); *C23C 14/568* (2013.01); *H01L 27/3244* (2013.01); *H01L 51/5256* (2013.01)

(58) Field of Classification Search
USPC .......................................... 427/66
See application file for complete search history.

(56) References Cited

U.S. PATENT DOCUMENTS

| | | | |
|---|---|---|---|
| 6,014,820 A * | 1/2000 | Jones ................. | B01D 53/0407 137/513.7 |
| 6,852,194 B2 * | 2/2005 | Matsushita ............. | C23C 16/54 118/719 |
| 2004/0035360 A1 | 2/2004 | Yamazaki et al. | |

(Continued)

FOREIGN PATENT DOCUMENTS

| | | |
|---|---|---|
| KR | 1020060036006 A | 4/2006 |
| KR | 100718555 B1 | 5/2007 |

(Continued)

*Primary Examiner* — Austin Murata
(74) *Attorney, Agent, or Firm* — Cantor Colburn LLP

(57) ABSTRACT

A deposition method using a deposition apparatus includes: depositing a first deposition layer on substrates in first process chambers of a first deposition cluster; transferring a substrate of the substrates in one of the first process chambers into a first transfer chamber of the first deposition cluster, which is connected to each of the first process chambers; transferring the substrate within the first transfer chamber of the first deposition cluster into a connection chamber, which is connected to the first transfer chamber and first and second gas supply lines; supplying a gas into the connection chamber through the second gas supply line to change an inside pressure of the connection chamber from a preset first pressure into a preset second pressure, which is different from an atmospheric pressure; and transferring the substrate within the connection chamber into a second transfer chamber of a second deposition cluster.

17 Claims, 2 Drawing Sheets

(56) References Cited

U.S. PATENT DOCUMENTS

| | | | | |
|---|---|---|---|---|
| 2005/0239294 | A1* | 10/2005 | Rosenblum | B05D 1/60 438/778 |
| 2011/0124192 | A1* | 5/2011 | Ganguli | C23C 16/18 438/653 |
| 2011/0245957 | A1* | 10/2011 | Porthouse | H01L 21/67109 700/114 |
| 2012/0097093 | A1* | 4/2012 | Gebele | H01L 21/67201 118/50 |

FOREIGN PATENT DOCUMENTS

| | | |
|---|---|---|
| KR | 101055688 B1 | 8/2011 |
| KR | 1020120067603 A | 6/2012 |
| KR | 1020120096101 A | 8/2012 |
| WO | 2006041240 A1 | 4/2006 |

* cited by examiner

DEPOSITION APPARATUS, DEPOSITION METHOD USING THE SAME, AND MANUFACTURING METHOD OF ORGANIC LIGHT-EMITTING DISPLAY APPARATUS

This application claims priority to Korean Patent Application No. 10-2013-0093336, filed on Aug. 6, 2013, and all the benefits accruing therefrom under 35 U.S.C. §119, the content of which in its entirety is herein incorporated by reference.

BACKGROUND

1. Field

One or more exemplary embodiments of the invention relate to a deposition apparatus, a deposition method using the deposition apparatus, and a manufacturing method of an organic light-emitting display apparatus, and more particularly, to a deposition apparatus that performs accurate deposition with reduced manufacturing costs, a deposition method using the deposition apparatus, and a manufacturing method of an organic light-emitting display apparatus.

2. Description of the Related Art

Generally, when a display apparatus is manufactured, various layers are deposited. For example, a semiconductor layer, a variety of electrodes, a variety of insulating layers, and the like are deposited to form a thin film transistor ("TFT") in each of pixels. Also, in a case where the display apparatus is an organic light-emitting display apparatus, a pixel electrode, an intermediate layer having a multilayer structure including an emission layer, and an opposite electrode are deposited to form an organic light-emitting device ("OLED") in each of pixels. In addition, a variety of passivation layers may be deposited to protect the OLED.

SUMMARY

When a conventional deposition apparatus is used to deposit a variety of layers for a display apparatus with substantially high accuracy, the manufacturing cost of the display apparatus may be increased.

One or more exemplary embodiments of the invention include a deposition apparatus that performs a substantially accurate deposition while reducing manufacturing costs and a deposition method using the deposition apparatus.

According to one or more exemplary embodiments of the invention, a deposition apparatus includes: a first deposition cluster including a plurality of first process chamber and a first transfer chamber connected to each of the plurality of first process chambers; a second deposition cluster including a plurality of second process chamber and a second transfer chamber connected to each of the plurality of second process chambers; a connection chamber connected to each of the first and second transfer chambers; a first gas supply line connected to the connection chamber; a second gas supply line; and an exhaust line.

In an exemplary embodiment, a maximum gas supply rate into the connection chamber through the second gas supply line may be less than a maximum gas supply rate into the connection chamber through the first gas supply line.

In an exemplary embodiment, a minimum gas supply rate into the connection chamber through the first gas supply line may be greater than the maximum gas supply rate into the connection chamber through the second gas supply line.

In an exemplary embodiment, the first gas supply line may supply a preset amount of gas into the connection chamber to change an inside pressure of the connection chamber into the atmospheric pressure.

In an exemplary embodiment, the second gas supply line may supply a preset amount of gas into the connection chamber to change the inside pressure of the connection chamber from a preset first pressure to a preset second pressure, which is different from an atmospheric pressure.

In an exemplary embodiment, a vacuum level within each of the plurality of first process chambers during a deposition performed therein may be greater than a vacuum level within each of the plurality of second process chambers during a deposition performed herein.

In an exemplary embodiment, an organic layer may be deposited on the substrate in the plurality of first process chambers, and an inorganic layer may be deposition on the substrate in the plurality of second process chambers. In such an embodiment, the connection chamber may be a flip chamber which flips the substrate disposed therein.

In an exemplary embodiment, the deposition apparatus may further include a flow rate controller connected to the second gas supply line to adjust a gas supply rate or an amount of gas supplied into the connection chamber through the second gas supply line.

In an exemplary embodiment, the deposition apparatus may further include a filter unit which filters a gas supplied into the connection chamber through the second gas supply line.

In an exemplary embodiment, the deposition apparatus may further include a plurality of nozzles disposed on an end portion of the second gas supply within the connection chamber to spray the gas supplied into the connection chamber through the second gas supply line in a plurality of directions within the connection chamber.

According to one or more exemplary embodiments of the invention, a deposition method using a deposition apparatus includes: depositing a first deposition layer on a plurality of substrates in a plurality of first process chambers of a first deposition cluster of the deposition apparatus; transferring a substrate of the plurality of substrate, on which the first deposition layer is deposited, in one of the plurality of first process chambers into a first transfer chamber of the first deposition cluster, where the first transfer chamber is connected to each of the plurality of first process chambers; transferring the substrate within the first transfer chamber of the first deposition cluster into a connection chamber of the deposition apparatus, where the connection chamber is connected to the first transfer chamber, a first gas supply line and a second gas supply line of the deposition apparatus; supplying a gas into the connection chamber through the second gas supply line to change an inside pressure of the connection chamber from a preset first pressure into a preset second pressure, where the preset second pressure is different from the atmospheric pressure; and transferring the substrate within the connection chamber into a second transfer chamber of a second deposition cluster of the deposition apparatus.

In an exemplary embodiment, the second gas supply line may have a maximum gas supply rate less than a maximum gas supply rate of the first gas supply line.

In an exemplary embodiment, the second gas supply line may have a maximum gas supply rate less than a minimum gas supply rate of the first gas supply line.

In an exemplary embodiment, the first gas supply line may be configured to supply a preset amount of gas into the connection chamber to change the inside pressure of the connection chamber into the atmospheric pressure.

In an exemplary embodiment, the deposition method may further include: transferring the substrate from the second transfer chamber of the second deposition cluster into one of a the plurality of second process deposition chambers of the second deposition cluster; and depositing a second deposition layer on the substrate within the one of the plurality of second process chambers.

In an exemplary embodiment, a vacuum level within each of the plurality of first process chambers in the depositing the first deposition layer may be greater than a vacuum level within each of the plurality of second process chambers in the depositing the second deposition layer.

In an exemplary embodiment, the depositing the first deposition layer may include depositing an organic layer, and the depositing the second deposition layer may include depositing an inorganic layer.

In an exemplary embodiment, the deposition method may further include flipping the substrate within the connection chamber.

In an exemplary embodiment, the supplying the gas into the connection chamber through the second gas supply line may include supplying a preset amount of the gas into the connection chamber using a flow rate controller, which is connected to the second gas supply line and adjusts a gas supply rate or an amount of gas supplied into the connection chamber through the second gas supply line.

According to one or more exemplary embodiments of the invention, a manufacturing method of an organic light-emitting display apparatus using a deposition apparatus includes: providing a plurality of organic light-emitting devices on a plurality of substrates, respectively; depositing a first deposition layer on the plurality of substrates in a plurality of first process chambers of a first deposition cluster of the deposition apparatus; transferring a substrate of the plurality of substrates, on which the first deposition layer is deposited, in one of the plurality of first process chambers into a first transfer chamber of the first deposition cluster, where the first transfer chamber is connected to each of the plurality of first process chambers; transferring the substrate within the first transfer chamber of the first deposition cluster into a connection chamber of the deposition apparatus, where the connection chamber is connected to the first transfer chamber, a first gas supply line and a second gas supply line of the deposition apparatus; supplying a gas into the connection chamber through the second gas supply line to change an inside pressure of the connection chamber from a preset first pressure into a preset second pressure, which is different from an atmospheric pressure; and transferring the substrate within the connection chamber into a second transfer chamber of a second deposition cluster of the deposition apparatus.

In an exemplary embodiment, the second gas supply line may have a maximum gas supply rate that is less than a maximum gas supply rate of the first gas supply line.

In an exemplary embodiment, the second gas supply line may have a maximum gas supply rate that is less than a minimum gas supply rate of the first gas supply line.

In an exemplary embodiment, the first gas supply line may be configured to supply a preset amount of gas into the connection chamber to change the inside pressure of the connection chamber into the atmospheric pressure.

In an exemplary embodiment, the manufacturing method may further include: transferring the substrate from the second transfer chamber of the second deposition cluster into one of a the plurality of second process deposition chambers of the second deposition cluster; and depositing a second deposition layer on the substrate within the one of the plurality of second process chambers.

In an exemplary embodiment, a vacuum level within each of the plurality of first process chambers in the depositing the first deposition layer may be greater than a vacuum level within each of the plurality of second process chambers in the depositing the second deposition layer.

In an exemplary embodiment, the depositing the first deposition layer may include depositing an organic layer, and the depositing the second deposition layer may include depositing an inorganic layer.

In an exemplary embodiment, the manufacturing method may further include flipping the substrate within the connection chamber.

In an exemplary embodiment, the supplying the gas into the connection chamber through the second gas supply line may include supplying a preset amount of gas into the connection chamber using a flow rate controller, which is connected to the second gas supply line and adjusts a gas supply rate into the connection chamber through the second gas supply line.

BRIEF DESCRIPTION OF THE DRAWINGS

The above and/or other features of the invention will become more apparent by describing in further detail exemplary embodiments thereof with reference to the accompanying drawings, in which.

DETAILED DESCRIPTION

Figure 1:
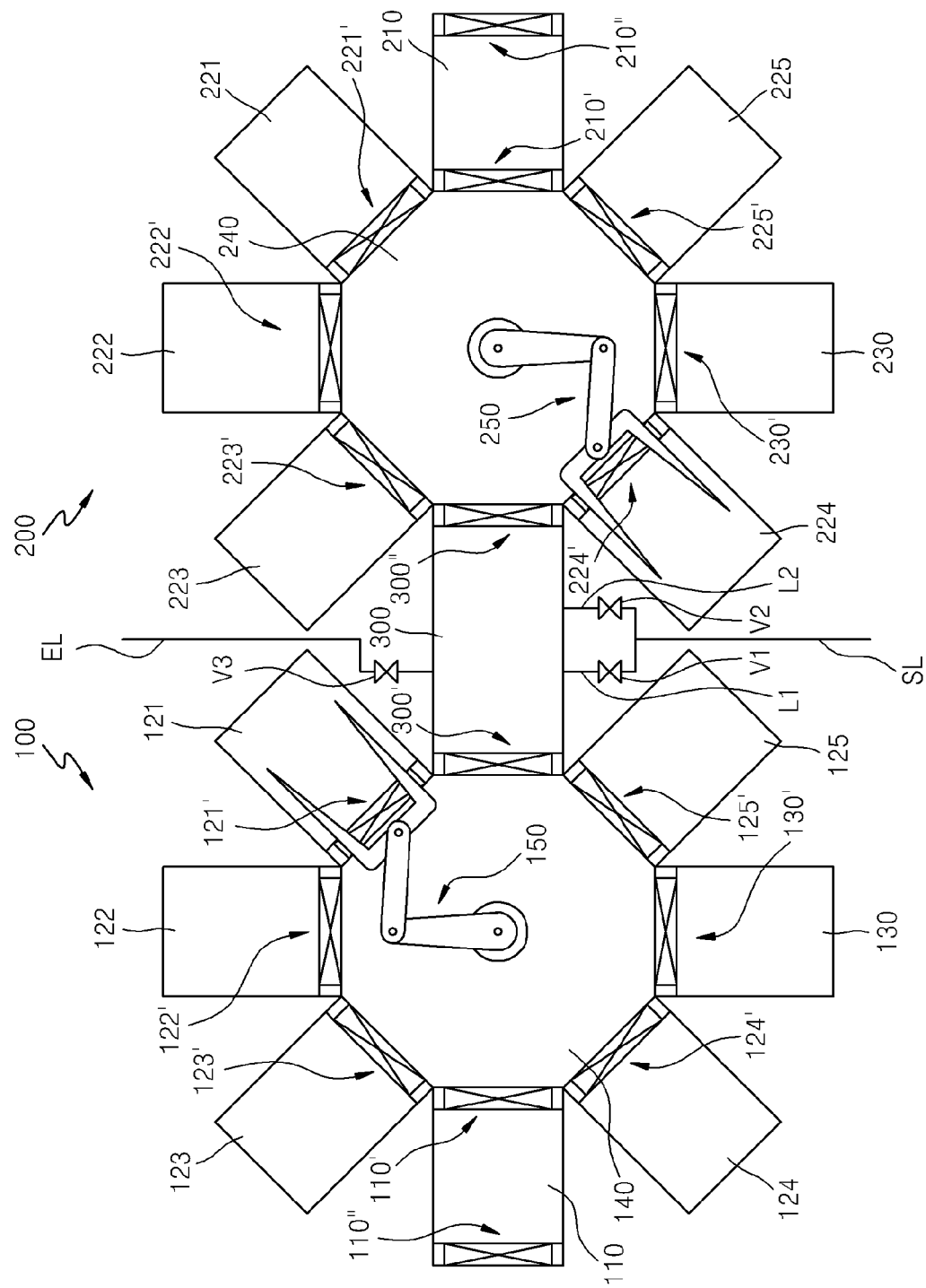
FIG. 1 is a schematic conceptual plan view of an exemplary embodiment of a deposition apparatus, according to the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, exemplary embodiments of the invention will be described with reference to the accompanying drawings.

FIG. 1 is a schematic conceptual plan view of an exemplary embodiment of a deposition apparatus, according to the invention. As shown in FIG. 1, an exemplary embodiment of the deposition apparatus, according to the invention, may include a first deposition cluster 100, a second deposition cluster 200, a connection chamber 300, a first gas supply line L1, a second gas supply line L2 and an exhaust line EL.

The first deposition cluster 100 may include a plurality of first process chambers 121, 122, 123, 124 and 125 and a first transfer chamber 140 disposed substantially at a center of the first deposition cluster 100 and connected to each of the plurality of first process chambers 121, 122, 123, 124 and 125. The plurality of first process chambers 121, 122, 123, 124 and 125 may each be a deposition chamber, in which a deposition process is performed on a substrate. In an exemplary embodiment, a same material may be deposited on a substrate in each of the plurality of first process chambers 121, 122, 123, 124 and 125. In such an embodiment, the deposition process is not performed several times on a single substrate through the plurality of first process chambers 121, 122, 123, 124 and 125, but is simultaneously performed on a plurality of substrates in the plurality of first process chambers 121, 122, 123, 124 and 125, respectively.

In an exemplary embodiment, as shown in FIG. 1, the first deposition cluster 100 may further include a loadlock chamber 110 or a first mask chamber 130. In such an embodiment, gate valves 110' and 130' are disposed between the loadlock chamber 110 and the first transfer chamber 140, and between the first mask chamber 130 and the first transfer chamber 140, respectively. The first deposition cluster 100 may further include a first transfer robot 150 including an end effector to load/unload a substrate into/from the loadlock chamber 110, the plurality of first process chambers 121, 122, 123, 124 and 125, the first mask chamber 130 and/or the first transfer chamber 140.

The loadlock chamber 110 may be a chamber in which a substrate is loaded from an external conveyor (not shown). A plurality of slots (not shown) may be disposed within the loadlock chamber 110 to load the plurality of substrates into the loadlock chamber 110. When a substrate is loaded into the loadlock chamber 110, the substrate may be disposed in one of the slots within the loadlock chamber 110 after a door 110" is opened.

After the substrate is loaded into the loadlock chamber 110, the door 110" is closed to block the inside of the loadlock chamber 110 from the outside. The gate valve 110' between the loadlock chamber 110 and the first transfer chamber 140 may be in a closed state before the substrate is loaded. Thereafter, a vacuum level of the loadlock chamber 110 may be substantially equal or similar to a vacuum level of the first transfer chamber 140 through a pump (not shown) connected to the loadlock chamber 110. When the vacuum level of the loadlock chamber 110 reaches the vacuum level of the first transfer chamber 140, the gate valve 110' between the loadlock chamber 110 and the first transfer chamber 140 is opened to transfer the substrate from the loadlock chamber 110 to the first transfer chamber 140.

The substrate within the first transfer chamber 140 may be loaded into one of the plurality of first process chambers 121, 122, 123, 124 and 125. In an exemplary embodiment, the first deposition cluster 100 may include a pre-processing chamber (not shown) such as a heating chamber. In such an embodiment, the substrate may be loaded into the pre-processing chamber to be pre-processed, and then the substrate may be loaded into one of the plurality of first process chambers 121, 122, 123, 124 and 125. In such an embodiment, gate valves 121', 122', 123', 124' and 125' may be disposed between the plurality of first process chambers 121, 122, 123, 124 and 125, and the first transfer chamber 140.

The second deposition cluster 200 may have a structure substantially similar to the structure of the first deposition cluster 100.

The second deposition cluster 200 may include a plurality of second process chambers 221, 222, 223, 224 and 225 and a second transfer chamber 240 disposed at an approximate center of the second deposition cluster 200 and connected to each of the plurality of second process chambers 221, 222, 223, 224 and 225. The plurality of second process chambers 221, 222, 223, 224 and 225 are each a deposition chamber in which a deposition process is performed on a substrate. In an exemplary embodiment, a same material may be deposited on the substrate disposed within each of the plurality of second process chambers 221, 222, 223, 224 and 225. In such an embodiment, a plurality of substrates may be simultaneously deposited within the plurality of second process chambers 221, 222, 223, 224 and 225, respectively. In such an embodiment, gate valves 221', 222', 223', 224' and 225' may be disposed between the plurality of second process chambers 221, 222, 223, 224 and 225 and the second transfer chamber 240.

In an exemplary embodiment, the second deposition cluster 200 may further include an unloading chamber 210 or a second mask chamber 230, as the first cluster 100 shown in FIG. 1. In such an embodiment, gate valves 210' and 230' are disposed between the unloading chamber 210 and the second transfer chamber 240, and between the second mask chamber 230 and the second transfer chamber 240, respectively. In such an embodiment, the second deposition cluster 200 may further include a second transfer robot 250 including an end effector to load/unload a substrate into/from the unloading chamber 210, the plurality of second process chambers 221, 222, 223, 224 and 225, the second mask chamber 230 and/or the second transfer chamber 240.

The connection chamber 300 may be connected to both of the first transfer chamber 140 of the first deposition cluster 100 and the second transfer chamber 240 of the second deposition cluster 200. Gate valves 300' and 300" may be disposed between the connection chamber 300 and the first transfer chamber 140 and between the connection chamber 300 and the second transfer chamber 240, respectively.

The substrate, on which the deposition process is performed within the first process chambers 121, 122, 123, 124 and 125 of the first deposition cluster 100, may be transferred from the first process chambers 121, 122, 123, 124 and 125 to the connection chamber 300 via the first transfer chamber 140 by the first transfer robot 150. Then, the substrate is transferred from the connection chamber 300 to the second transfer chamber 240 of the second deposition cluster 200 by the second transfer robot 250. Thereafter, the substrate may be transferred from the second transfer chamber 240 of the second deposition cluster 200 into one of the plurality of second process chambers 221, 222, 223, 224 and 225. In an exemplary embodiment, the second deposition cluster 200 may include a pre-processing chamber (not shown) such as a heating chamber. In such an embodiment, the substrate may be loaded into the pre-processing chamber to be pre-processed, and then the substrate may be loaded into one of the plurality of second process chambers 221, 222, 223, 224 and 225.

The substrate, on which the deposition process is performed within the plurality of second process chambers 221, 222, 223, 224 and 225, is unloaded from the plurality of second process chambers 221, 222, 223, 224 and 225 by the second transfer robot 250, and then the substrate is loaded into the unloading chamber 210 via the second transfer chamber 240. A plurality of slots (not shown) may be disposed within the unloading chamber 210 to load a plurality of substrates. When the substrates are loaded into the unloading chamber 210, the substrates may be placed in the slots within the unloading chamber 210 after the gate valve 210' is opened.

After the substrates are loaded into the unloading chamber 210, the gate valve 210' is closed to block the inside of the unloading chamber 210 from the second transfer chamber 240 of the second deposition cluster 200. Then, the inside of the unloading chamber 210 becomes substantially similar to surroundings thereof, e.g., the outside of the second deposition cluster 200, through a gas supply line (not shown) connected to the unloading chamber 210. Then, a door 210" may be opened to unload the substrates within the unloading chamber 210 to the outside of the second deposition cluster 200.

In such an embodiment of the deposition apparatus according to the invention, a material deposited on the substrates in the first deposition cluster 100 may differ from a material deposited on the substrates in the second deposition cluster 200. In one exemplary embodiment, for example, an organic layer may be deposited on the substrates within the first process chambers 121, 122, 123, 124 and 125 of the first deposition cluster 100, and an inorganic layer may be deposited on the substrates within the plurality of second process chambers 221, 222, 223, 224 and 225 of the second deposition cluster 200. In such an embodiment, a deposition environment within the plurality of first process chambers 121, 122, 123, 124 and 125 may differ from a deposition environment within the plurality of second process chambers 221, 222, 223, 224 and 225.

In an exemplary embodiment, a layer deposited on each of the substrates within the plurality of first process chambers 121, 122, 123, 124 and 125 of the first deposition cluster 100 may be provided, e.g., formed, substantially at a vacuum level, in which each of the plurality of first process chambers 121, 122, 123, 124 and 125 has an inner pressure of about $10^{-3}$ pascal (Pa). In such an embodiment, a layer deposited on each of the substrates within the plurality of second process chambers 221, 222, 223, 224 and 225 of the second deposition cluster 200 may be formed substantially at a vacuum level, in which each of the plurality of second process chambers 221, 222, 223, 224 and 225 has an inner pressure of about 1 Pa. Herein, the vacuum level may refer to a residual pressure in a vacuum system. In such an embodiment, each of the plurality of first process chambers 121, 122, 123, 124 and 125 of the first deposition cluster 100 and the first transfer chamber 140 connected thereto may be maintained at a pressure of about $10^{-3}$ Pa without changing an inner pressure thereof. In such an embodiment, each of the plurality of second process chambers 221, 222, 223, 224 and 225 of the second deposition cluster 200 and the second transfer chamber 240 connected thereto may be maintained at a pressure of about 1 Pa without changing an inner pressure thereof.

In an exemplary embodiment, as described above, the first deposition cluster 100 is connected to the second deposition cluster 200 by the connection chamber 300. Thus, a substrate, on which a first deposition layer is deposited in the first deposition cluster 100, is transferred into the second deposition cluster 200 to deposit a second deposition layer. Thus, in such an embodiment, the substrate may be transferred from the first deposition cluster 100 to the second deposition cluster 200 through the connection chamber 300 while the first deposition cluster 100 is maintained at a pressure of about $10^{-3}$ Pa and the second deposition cluster 200 is maintained at a pressure of about 1 Pa.

In such an embodiment, a vacuum level within the connection chamber 300 and a vacuum level in the first deposition cluster 100 may be substantially the same as each other. Then, when a first deposition layer is deposited on a substrate in the first deposition cluster 100, the gate valve 300' between the first deposition cluster 100 and the connection chamber 300 is opened to transfer the substrate into the connection chamber 300 by the first transfer robot 150. Then, when the gate valve 300' is closed, a preset amount of gas may be supplied into the connection chamber 300 through the second gas supply line L2 connected to the connection chamber 300.

In an exemplary embodiment, the preset amount of gas may be a sufficient amount of gas to change the vacuum level within the connection chamber 300 from the vacuum level within the first deposition cluster 100 into the vacuum level within the second deposition cluster 200 when the preset amount of gas is supplied into the connection chamber 300. Accordingly, the vacuum level within the connection chamber 300 may become about 1 Pa that corresponds to the vacuum level within the second deposition cluster 200. Then, the gate valve 300" between the second deposition cluster 200 and the connection chamber 300 is opened. Thus, in a state where the vacuum level within the second deposition cluster 200 is not changed, the substrate within the connection chamber 300 may be transferred into the second deposition cluster 200 by the second transfer robot 250. In such an embodiment, the second gas supply line L2 allows only a preset amount of gas to be supplied into the connection chamber 300, such that an accurate amount of gas may be quickly supplied into the connection chamber 300.

When the substrate within the connection chamber 300 is transferred into the second deposition cluster 200, the gate valve 300" is closed to discharge a preset amount of gas within the connection chamber 300 to the outside of the connection chamber 300 through the exhaust line EL connected to the connection chamber 300, such that the vacuum level within the connection chamber 300 and the vacuum level within the first deposition cluster 100 may become substantially the same as each other. Thus, the substrate may be transferred from the first deposition cluster 100 to the connection chamber 300 without changing the vacuum level within the first deposition cluster 100.

In an exemplary embodiment, as described above, the second gas supply line L2 may be configured to supply an amount of gas that corresponds to a difference between the vacuum levels of the first and second deposition clusters 100 and 200 into the connection chamber 300. In such an embodiment, when the vacuum level within the connection chamber 300 is changed into the atmospheric pressure to maintain and repair the connection chamber 300, the gas may be supplied into the connection chamber 300 through the first gas supply line L1, but may not be supplied through the second gas supply line L2.

In an alternative exemplary embodiment, only the first gas supply line L1 may be mounted on the connection chamber 300 and the second gas supply line L2 may be omitted. However, in such an embodiment, an amount of gas corresponding to the difference between the vacuum levels of the first deposition cluster 100 and the second deposition cluster 200 may not be substantially accurately and quickly supplied through the first gas supply line L1. In an exemplary embodiment, where an amount of gas for changing the vacuum level of the connection chamber 300 into the atmospheric pressure to maintain and repair the connection chamber 300 is supplied through the first gas supply line L1, and an amount of gas corresponding to the difference between the vacuum levels of the first deposition cluster 100 and the second deposition cluster 200 is supplied through the first gas supply line L1, an accurate amount of gas may not be substantially quickly supplied when the amount of gas corresponding to the vacuum level difference is supplied.

In one exemplary embodiment, for example, the gas supplied through the first gas supply line L1 and the second gas supply line L2 may be nitrogen (N2) or a gas of substantially the same type as N2. In such an embodiment, the first gas supply line L1 and the second gas supply line L2 may be branched from a same supply line SL. Valves, e.g., first to third valves V1 to V3, may be disposed in the first gas supply line L1, the second gas supply line L2 and the exhaust line EL, respectively. In an exemplary embodiment, a pump (not shown) may be provided in the first gas supply line L1, the second gas supply line L2 or the exhaust line EL.

In an exemplary embodiment, as described above, the first gas supply line L1 supplies the gas when the inside pressure of the connection chamber 300 is changed into the atmospheric pressure to maintain or repair the connection chamber 300. The second gas supply line L2 accurately supplies the amount (relatively less amount) of gas corresponding to the difference between the vacuum levels of the first deposition cluster 100 and the second deposition cluster 200 into the connection chamber 300. Thus, an amount of gas supplied through the first gas supply line L1 per unit time may be greater than an amount of gas supplied through the second gas supply line L2 per unit time.

In an exemplary embodiment, a maximum gas supply rate into the connection chamber 300 through the second gas supply line L2 may be less than a maximum gas supply rate into the connection chamber 300 through the first gas supply line L1. In such an embodiment, a minimum gas supply rate into the connection chamber 300 through the first gas supply line L1 may be greater than the maximum gas supply rate into the connection chamber 300 through the second gas supply line L2. In an exemplary embodiment, where the amount of gas supplied through the first gas supply line L1 per unit time may be greater than the amount of gas supplied through the second gas supply line L2 per unit time, the inside pressure of the connection chamber 300 may be quickly changed into the atmospheric pressure when the inside pressure of the connection chamber 300 is changed into the atmospheric pressure to maintain and repair the connection chamber 300.

As described above, in an exemplary embodiment, the first deposition cluster 100 has an inside pressure of about $10^{-3}$ Pa and the second deposition cluster 200 has an inside pressure of about 1 Pa, but not being limited thereto. In an alternative exemplary embodiment, the inside of the first deposition cluster 100 may have a first pressure, which is different from the pressure of about $10^{-3}$ Pa, and the inside of the second deposition cluster 200 may have a second pressure, which is different from the pressure of about 1 Pa.

In an exemplary embodiment, when a material deposited on a substrate in the first deposition cluster 100 differs from a material deposited on a substrate in the second deposition cluster 200, a deposition direction may vary. In one exemplary embodiment, for example, when an organic layer is deposited on a substrate within the plurality of first process chambers 121, 122, 123, 124 and 125 of the first deposition cluster 100, a deposition surface of the substrate, on which an organic material is deposited, may face up. In such an embodiment, when an inorganic layer is deposited on a substrate within the plurality of second process chambers 221, 222, 223, 224 and 225 of the second deposition cluster 200, a deposition surface of the substrate, on which an inorganic material is deposited, may face down. In such an embodiment, the connection chamber 300 connecting the first deposition cluster 100 to the second deposition cluster 200 may be a flip chamber, in which a substrate may be flipped or moved upside down. In such an embodiment, when the substrate is flipped, the first deposition cluster 100 and the second deposition cluster 200 may be connected to each other through one connection chamber, such that an overall configuration of the deposition apparatus may be simplified.

As described above, the first gas supply line L1 may be configured to supply a gas into the connection chamber 300 when the connection chamber 300 is maintained and repaired. In such an embodiment, the second gas supply line L2 is not used when the connection chamber 300 is maintained or repaired, and the second gas supply line L2 is configured to supply a gas into the connection chamber 300 when the deposition process is performed on a substrate by using the first deposition cluster 100 and the second deposition cluster 200. As a result, the deposition apparatus may effectively prevent impurities from being mixed into the supplied gas. In an exemplary embodiment, the deposition apparatus may further include a filter unit (not shown) for filtering the gas supplied into the connection chamber 300 through the second gas supply line L2. In one exemplary embodiment, for example, the filter unit may be directly installed in the second gas supply line L2.

In such an embodiment, the second gas supply line L2 may supply an amount of gas corresponding to a difference between inner pressures of the first deposition cluster 100 and the second deposition cluster 200 into the connection chamber 300. In an exemplary embodiment, a flow rate controller (not shown), which is connected to the second gas supply line L2 to accurately adjust an amount of gas supplied into the connection chamber 300, may be further disposed to accurately adjust a pressure.

Figure 2:
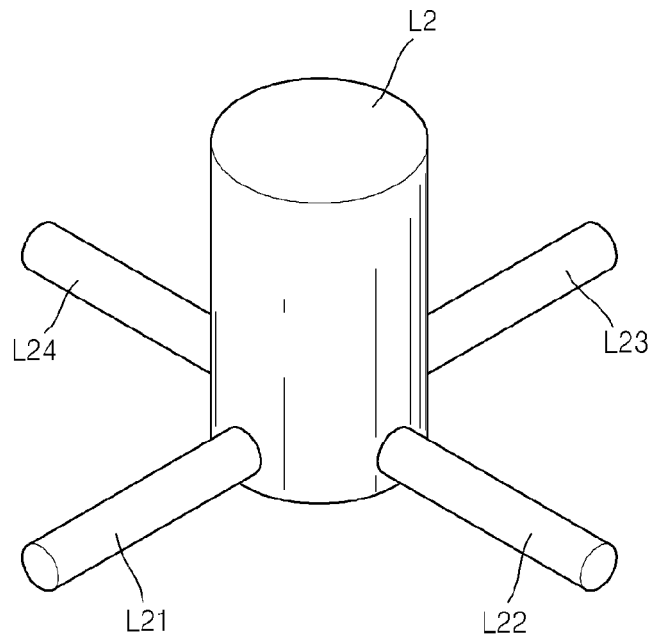
FIG. 2 is a schematic perspective view of an end portion of an exemplary embodiment of a gas supply line in the deposition apparatus of FIG. 1.

FIG. 2 is a schematic perspective view of an end portion of an exemplary embodiment of a gas supply line in the deposition apparatus of FIG. 1. FIG. 2 shows an end portion of the second gas supply line L2. As shown in FIG. 2, a plurality of nozzles L21, L22, L23 and L24 may be disposed on an end portion of the second gas supply line L2, which is disposed in the connection chamber 300, such that the gas supplied into the connection chamber 300 through the second gas supply line L2 is sprayed and supplied in a plurality of directions within the connection chamber 300.

As described above, the first gas supply line L1 is configured to supply a gas into the connection chamber 300 when the connection chamber 300 is maintained and repaired. In such an embodiment, the second gas supply line L2 is configured to supply a gas into the connection chamber 300 when a deposition process is performed on a substrate by the first deposition cluster 100 and the second deposition cluster 200. In such an embodiment, when the gas is supplied into the connection chamber 300 through the second gas supply line L2, the substrate may be damaged by the gas supplied to the connection chamber 300. If gas stream is significantly changed within the connection chamber 300 when the gas is supplied into the connection chamber 300 through the second gas supply line L2, impurities such as dust, which may exist on an inner wall or floor of the connection chamber 300, may move on the substrate, and thus, substrate defects may occur.

In an exemplary embodiment of the deposition apparatus according to the invention, where the plurality of nozzles L21, L22, L23 and L24 are disposed on the end portion of the second gas supply line L2 within the connection chamber 300 as shown in FIG. 2, the gas supplied into the connection chamber 300 through the second gas supply line L2 may be sprayed and supplied in a plurality of directions within the connection chamber 300. Thus, the gas stream within the connection chamber 300 may be substantially reduced when compared to a case in which a gas is supplied in a single direction through a single nozzle.

In an exemplary embodiment, where the deposition apparatus includes the first deposition cluster 100 and the second deposition cluster 200 as shown in FIG. 1, the deposition apparatus may further include an additional deposition cluster. In such an embodiment, the second deposition cluster 200 may not include the unloading chamber 210, and an additional connection chamber similar to the connection chamber 300 may be disposed between the second deposition cluster 200 and the additional deposition cluster. In such an embodiment, components similar to the first gas supply line L1, the second gas supply line L2 and the exhaust line EL may be connected to the additional connection chamber.

Hereinafter, an exemplary embodiment of a deposition method according to the invention will be described.

In an exemplary embodiment of a deposition method, according to the invention, a process of depositing a first deposition layer on a plurality of substrates within a plurality of first process chambers 121, 122, 123, 124 and 125 of a first deposition cluster 100 is performed. In such an embodiment, a process of transferring a substrate, on which a first deposition layer is deposited within one of the plurality of first process chambers 121, 122, 123, 124 and 125, into a first transfer chamber 140 of the first deposition cluster 100 connected to each of the plurality of first process chambers 121, 122, 123, 124 and 125 is performed. Then, a process of transferring the substrate within the first transfer chamber 140 of the first deposition cluster 100 into a connection chamber 300 connected to the first transfer chamber 140 is performed.

When the substrate is transferred into the connection chamber 300, a gas may be supplied into the connection chamber 300 through a second gas supply line L2 of gas supply lines, e.g., a first gas supply line L1 and the second gas supply line L2, which are connected to the connection chamber 300, to change the inside pressure of the connection chamber 300 from a preset first pressure that is equal or similar to a pressure within the first deposition cluster 100 to a preset second pressure that is substantially equal or similar to a pressure within a second deposition cluster 200, which is different from the atmospheric pressure. Thereafter, the substrate within the connection chamber 300 may be transferred into a second transfer chamber 240 of the second deposition cluster 200.

In such an embodiment of the deposition method, when a pressure within the connection chamber 300 is changed from the first pressure to the second pressure, only the second gas supply line L2 that supplies a sufficient amount of gas to change the inside pressure of the connection chamber 300 from the first pressure to the second pressure operates. Thus, the pressure within the connection chamber 300 may be substantially quickly and accurately changed from the first pressure to the second pressure. In one exemplary embodiment, for example, the first pressure may be about $10^{-3}$ Pa, and the second pressure may be about 1 Pa.

The process of changing the inside pressure of the connection chamber 300 from the first pressure to the second pressure may include a process of supplying a gas into the connection chamber 300 through the second gas supply line L2 having a maximum gas supply rate that is less than a maximum gas supply rate of the first gas supply line L1 to the connection chamber 300. In such an embodiment, the first gas supply line L1 is used for supplying the gas to the connection chamber 300 to change a pressure within the connection chamber 300 into the atmospheric pressure to maintain and repair the connection chamber 300. Accordingly, the process of changing the inside pressure of the connection chamber 300 from the first pressure to the second pressure may include a process of supplying a gas into the connection chamber 300 through the second gas supply line L2 having a maximum gas supply rate that is less than a minimum gas supply rate in the connection chamber 300 through the first gas supply line L1.

After the substrate within the connection chamber 300 is transferred into the second transfer chamber 240 of the second deposition cluster 200, the substrate may be transferred into one of the plurality of second process chambers 221, 222, 223, 224 and 225 of the second deposition cluster 200 from the second transfer chamber 240 of the second deposition cluster 200. Then, a second deposition layer may be deposited on the substrate within at least one of the plurality of second process chambers 221, 222, 223, 224 and 225.

In an exemplary embodiment, as described above, when the substrate is transferred between the first and second deposition clusters 100 and 200, in which different materials are deposited, a pressure within the connection chamber 300 may be accurately and quickly adjusted to substantially reduce deposition defects and manufacturing costs, thereby effectively realizing accurate deposition. In one exemplary embodiment, for example, the process of depositing the first deposition layer may include a process of depositing an organic layer, and the process of depositing the second deposition layer may include a process of depositing an inorganic layer. When the substrate faces different directions during the depositions within the first and second deposition clusters 100 and 200, a process of flipping the substrate may be performed.

The process of changing the inner pressure of the connection chamber 300 from the first pressure to the second pressure may include a process of supplying a preset amount of gas into the connection chamber using a flow rate controller that is connected to the second gas supply line L2 to adjust a gas supply rate or an amount of gas supplied into the connection chamber 300. In such an embodiment, a plurality of nozzles L21, L22, L23 and L24 may be disposed on an end portion of the second gas supply line L2 within the connection chamber 300 such that the gas supplied into the connection chamber 300 through the second gas supply line L2 may be spread and supplied in a plurality of directions within the connection chamber 300 to reduce a change of gas stream within the connection chamber 300.

Figure 3:
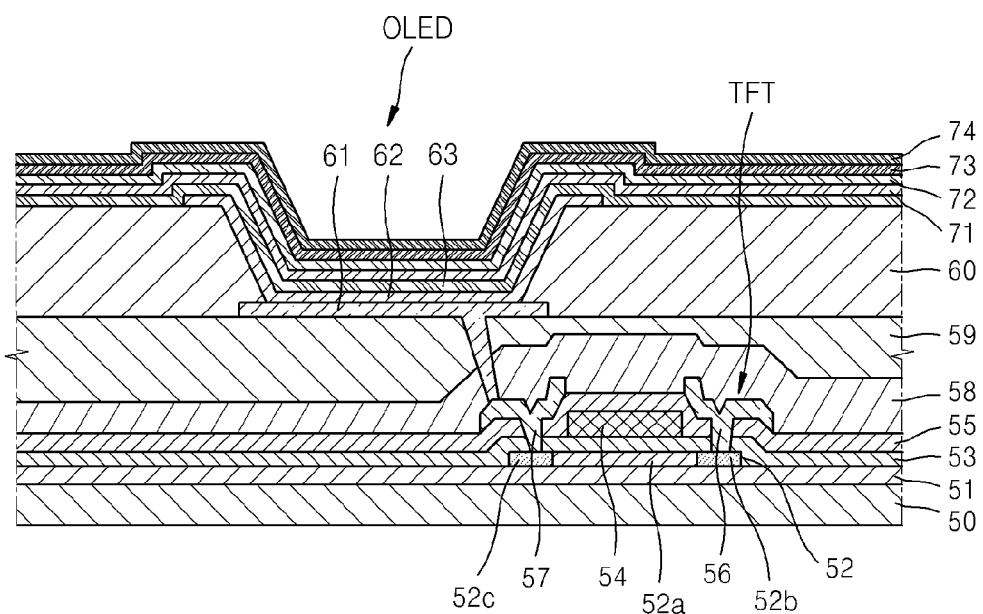
FIG. 3 is a schematic cross-sectional view of an exemplary embodiment of an organic light-emitting display apparatus, which is manufactured using the deposition apparatus of FIG. 1.

FIG. 3 is a schematic cross-sectional view of an exemplary embodiment of an organic light-emitting display apparatus, which is manufactured using the deposition apparatus of FIG. 1.

Referring to FIG. 3, a variety of components of the organic light-emitting display apparatus is provided, e.g., formed, on a substrate 50. The substrate 50 may include a transparent material, e.g., a glass material, a plastic material or a metallic material.

A common layer, such as a buffer layer 51, a gate insulating layer 53 and an interlayer insulating layer 55, may be provided on substantially an entire surface of the substrate 50. Also, a patterned semiconductor layer 52, including a channel region 52a, a source contact region 52b and a drain contact region 52c, may be provided on the substrate 50. Also, a gate electrode 54, a source electrode 56 and a drain electrode 57, which constitute a thin film transistor ("TFT") together with the patterned semiconductor 52, may be provided on the substrate 50.

Also, a passivation layer 58 that covers the TFT and may be provided on substantially the entire surface of the substrate 50, and a planarization layer 59 having a substantially flat top surface is provided on the passivation layer 58. An organic light-emitting device ("OLED"), including a patterned pixel electrode 61, an opposite electrode 63 corresponding to substantially the entire surface of the substrate 50, and a multilayered intermediate layer 62 provided between the pixel electrode 61 and the opposite electrode 63 and including an emission layer, may be provided on the planarization layer 59. In an alternative exemplary embodiment, a portion of the intermediate layer 62 may be a common layer corresponding to substantially the entire surface of the substrate 50, and the other portion of the intermediate layer 62 may be a pattern layer patterned to correspond to a pixel electrode 61. The pixel electrode 61 may be electrically connected to the TFT through a via hole, which is formed through the passivation layer 58 and the planarization layer 59. A pixel-defining layer 60, which covers an edge of the pixel electrode 61 and in which an opening for defining each of pixel regions is formed, may be provided on the planarization layer 59 to correspond to substantially the entire surface of the substrate 50.

In an exemplary embodiment, as shown in FIG. 3, organic layers 71 and 73 and inorganic layers 72 and 74 are alternately provided on the OLED to define an encapsulating layer, such that the OLED is effectively protected from impurities such as external oxygen and moisture, for example.

In the organic light-emitting display apparatus, the encapsulating layer may be provided using an exemplary embodiment of the deposition apparatus or a deposition method, according to the invention. In an exemplary embodiment, the organic layers may be deposited in the first deposition cluster 100, and the inorganic layers may be deposited in the second deposition cluster 200. In such an embodiment, an additional organic layer deposition cluster and an additional inorganic layer deposition cluster may be provided to quickly and accurately form the encapsulating layer as shown in FIG. 3.

As described above, according to the exemplary embodiments of the invention described herein, the deposition apparatus performs a substantially accurate deposition, while substantially reducing manufacturing costs, and the deposition method may be performed using the deposition apparatus. However, the invention should not be construed as being limited to the exemplary embodiments set forth herein. Rather, these exemplary embodiments are provided so that this disclosure will be thorough and complete and will fully convey the concept of the present invention to those skilled in the art.

While the present invention has been particularly shown and described with reference to exemplary embodiments thereof, it will be understood by those of ordinary skill in the art that various changes in form and details may be made therein without departing from the spirit or scope of the present invention as defined by the following claims.

What is claimed is:

1. A deposition method using a deposition apparatus, the deposition method comprising:
  depositing a first deposition layer on a plurality of substrates in a plurality of first process chambers of a first deposition cluster of the deposition apparatus;
  transferring a substrate of the plurality of substrates, on which the first deposition layer is deposited, in one of the plurality of first process chambers, into a first transfer chamber of the first deposition cluster, where the first transfer chamber is connected to each of the plurality of first process chambers;
  transferring the substrate within the first transfer chamber of the first deposition cluster into a connection chamber of the deposition apparatus, wherein the connection chamber is connected to the first transfer chamber, a first gas supply line and a second gas supply line of the deposition apparatus;
  flipping the substrate within the connection chamber;
  supplying a gas into the connection chamber through the second gas supply line, to change an inside pressure of the connection chamber from a preset first pressure into a preset second pressure, wherein the preset second pressure is different from an atmospheric pressure;
  transferring the substrate within the connection chamber into a second transfer chamber of a second deposition cluster of the deposition apparatus;
  transferring the substrate from the second transfer chamber of the second deposition cluster into one of a plurality of second process chambers of the second deposition cluster; and
  depositing a second deposition layer on the substrate within the one of the plurality of second process chambers,
  wherein a vacuum level within each of the plurality of first process chambers in the depositing the first deposition layer is greater than a vacuum level within each of the plurality of second process chambers in the depositing the second deposition layer,
  wherein the depositing the first deposition layer comprises depositing an organic layer, and the depositing the second deposition layer comprises depositing an inorganic layer.

2. The deposition method of claim 1, wherein the second gas supply line has a maximum gas supply rate less than a maximum gas supply rate of the first gas supply line.

3. The deposition method of claim 1, wherein the second gas supply line has a maximum gas supply rate less than a minimum gas supply rate of the first gas supply line.

4. The deposition method of claim 1, wherein the first gas supply line is configured to supply a preset amount of gas into the connection chamber to change the inside pressure of the connection chamber to atmospheric pressure.

5. The deposition method of claim 1, wherein
  the flipping the substrate within the connection chamber occurs between the depositing the first deposition layer and the depositing the second deposition layer.

6. The deposition method of claim 1, wherein the supplying the gas into the connection chamber through the second gas supply line comprises supplying a preset amount of the gas into the connection chamber using a flow rate controller, which is connected to the second gas supply line and adjusts a gas supply rate into the connection chamber through the second gas supply line.

7. The deposition method of claim 1,
  wherein
  the flipping the substrate within the connection chamber occurs between the depositing the organic layer and the depositing the inorganic layer.

8. A manufacturing method of an organic light-emitting display apparatus using a deposition apparatus, the method comprising:
  providing a plurality of organic light-emitting devices on a plurality of substrates, respectively;
  depositing a first deposition layer on the plurality of substrates in a plurality of first process chambers of a first deposition cluster of the deposition apparatus;
  transferring a substrate of the plurality of substrates, on which the first deposition layer is deposited in one of the plurality of first process chambers, into a first transfer chamber of the first deposition cluster, wherein the first transfer chamber is connected to each of the plurality of first process chambers;
  transferring the substrate within the first transfer chamber of the first deposition cluster into a connection chamber of the deposition apparatus, wherein the connection chamber is connected to the first transfer chamber, a first gas supply line and a second gas supply line of the deposition apparatus;
  flipping the substrate within the connection chamber;
  supplying a gas into the connection chamber through the second gas supply line to change an inside pressure of the connection chamber from a preset first pressure into a preset second pressure, wherein the preset second pressure is different from an atmospheric pressure; and
  transferring the substrate within the connection chamber into a second transfer chamber of a second deposition cluster of the deposition apparatus.

9. The manufacturing method of claim 8, wherein the second gas supply line has a maximum gas supply rate less than a maximum gas supply rate of the first gas supply line.

10. The manufacturing method of claim 8, wherein the second gas supply line has a maximum gas supply rate less than a minimum gas supply rate of the first gas supply line.

11. The manufacturing method of claim 8, wherein the first gas supply line is configured to supply a preset amount of gas into the connection chamber to change the inside pressure of the connection chamber to atmospheric pressure.

12. The manufacturing method of claim 8, further comprising:
  transferring the substrate from the second transfer chamber of the second deposition cluster into one of a plurality of second process chambers of the second deposition cluster; and
  depositing a second deposition layer on the substrate within the one of the plurality of second process chambers.

13. The manufacturing method of claim 12, wherein a vacuum level within each of the plurality of first process chambers in the depositing the first deposition layer is greater than a vacuum level within each of the plurality of second process chambers in the depositing the second deposition layer.

14. The manufacturing method of claim 13, wherein
  the depositing the first deposition layer comprises depositing an organic layer, and
  the depositing the second deposition layer comprises depositing an inorganic layer.

15. The manufacturing method of claim 14,
  wherein the flipping the substrate within the connection chamber occurs between the depositing the organic layer and the depositing the inorganic layer.

16. The manufacturing method of claim 8, wherein the flipping the substrate within the connection chamber occurs between the depositing the first deposition layer and the depositing the second deposition layer.

17. The manufacturing method of claim 8, wherein the supplying the gas into the connection chamber through the second gas supply line comprises supplying a preset amount of gas into the connection chamber using a flow rate controller, which is connected to the second gas supply line and adjusts a gas supply rate into the connection chamber through the second gas supply line.

* * * * *